US012633350B2

(12) United States Patent
Hsieh

(10) Patent No.: US 12,633,350 B2
(45) Date of Patent: May 19, 2026

(54) MEMORY ARRAY CIRCUIT, TERNARY CONTENT ADDRESSABLE MEMORY AND OPERATION METHOD THEREOF

(71) Applicant: eRaytroniks Co., Ltd., Kaohsiung City (TW)

(72) Inventor: E Ray Hsieh, Taoyuan City (TW)

(73) Assignee: eRaytroniks Co., Ltd., Kaohsiung City (TW)

( * ) Notice: Subject to any disclaimer, the term of this patent is extended or adjusted under 35 U.S.C. 154(b) by 78 days.

(21) Appl. No.: 18/755,664

(22) Filed: Jun. 26, 2024

(65) Prior Publication Data

US 2025/0006271 A1     Jan. 2, 2025

Related U.S. Application Data

(60) Provisional application No. 63/523,665, filed on Jun. 28, 2023.

(30) Foreign Application Priority Data

May 31, 2024     (TW) ................................. 113120353

(51) Int. Cl.
*G11C 15/04* (2006.01)
*G11C 16/00* (2006.01)
*G11C 16/10* (2006.01)
*G11C 16/16* (2006.01)
*G11C 16/26* (2006.01)

(52) U.S. Cl.
CPC .......... *G11C 16/102* (2013.01); *G11C 15/046* (2013.01); *G11C 16/16* (2013.01); *G11C 16/26* (2013.01)

(58) Field of Classification Search
CPC ..... G11C 16/102; G11C 15/046; G11C 16/16; G11C 16/26
USPC ..................................................... 365/189.011
See application file for complete search history.

(56) References Cited

U.S. PATENT DOCUMENTS

2015/0348629 A1* 12/2015 Chang ................ G11C 13/0002
                                                            365/49.17
2016/0027507 A1*  1/2016 Chung ............... G11C 13/0026
                                                            257/4
2018/0040374 A1   2/2018 Zheng et al.
2023/0306250 A1*  9/2023 Zhang .................. G11C 7/1006

* cited by examiner

*Primary Examiner* — Ly D Pham
(74) *Attorney, Agent, or Firm* — CKC & Partners Co., LLC

(57) ABSTRACT

The present disclosure provides a ternary content addressable memory, which includes a first memory unit and a second memory unit, and the second memory unit is electrically connected to the first memory unit. The first memory unit includes a control transistor and a first variable impedance passive component. One end of the first variable impedance passive component is electrically connected to the gate of the control transistor. The second memory unit includes a data transistor and a second variable impedance passive component. The data transistor is connected in series with the control transistor, and one end of the second variable impedance passive component is electrically connected to the gate of the data transistor.

18 Claims, 8 Drawing Sheets

| | CL | | WL | | ML | BL | | DL | |
|---|---|---|---|---|---|---|---|---|---|
| first/second memory unit | 110 | 120 | 110 | 120 | | 210 | 220 | 210 | 220 |
| program | $V_{PGM}$ | float | float | $V_{PGM}$ | float | 0V | 0V | 0V | 0V |
| erase | 0V | float | float | 0V | float | $V_{ERS}$ | float | float | $V_{ERS}$ |
| read | $V_{READ}$ | 0V | 0V | $V_{READ}$ | 0V | $V_{TEST}$ | 0V | 0V | $V_{TEST}$ |

Fig. 3

| mode | CL | WL | $R_{ctr}$ | $R_{data}$ | DL | BL | ML |
|------|----|----|-----------|-----------|----|----|----|
| Care | $V_{dd}$ | | MRS | LRS | 0V | $V_{dd}$ | 0V (first search result) |
| | | | | LRS | $V_{dd}$ | 0V | $V_{dd}$ (second search result) |
| | | | | HRS | 0V | $V_{dd}$ | $V_{dd}$ (second search result) |
| | | | | HRS | $V_{dd}$ | 0V | 0V (first search result) |
| Don't Care | | | GRS | LRS | | | |
| | | | | HRS | | | |

LRS<MRS<HRS<GRS

Resistance →

Fig. 4

| first/second memory unit | WL | ML | BL | | DL | |
|---|---|---|---|---|---|---|
| | | | 210 | 220 | 210 | 220 |
| program | $V_{PGM}$ | float | 0V | 0V | 0V | 0V |
| erase | 0V | float | $V_{ERS}$ | float | float | $V_{ERS}$ |
| read | $V_{READ}$ | 0V | $V_{TEST}$ | 0V | 0V | $V_{TEST}$ |

Fig. 5

| mode | WL | $R_{ctr}$ | $R_{data}$ | DL | BL | ML |
|------|----|-----------|-----------|----|----|----|
| Care | $V_{dd}$ | MRS | LRS | 0V | $V_{dd}$ | 0V (first search result) |
| | | | LRS | $V_{dd}$ | 0V | $V_{dd}$ (second search result) |
| | | | HRS | 0V | $V_{dd}$ | $V_{dd}$ (second search result) |
| | | | HRS | $V_{dd}$ | 0V | 0V (first search result) |
| Don't Care | | GRS | LRS | | | |
| | | | HRS | | | |

LRS<MRS<HRS<GRS
Resistance →

Fig. 6

MEMORY ARRAY CIRCUIT, TERNARY CONTENT ADDRESSABLE MEMORY AND OPERATION METHOD THEREOF

RELATED APPLICATIONS

This application claims priority to U.S. Provisional Patent Application No. 63/523,665, filed Jun. 28, 2023 and Taiwan Patent Application No. 113120353, filed May 31, 2024, the entirety of which is herein incorporated by reference.

BACKGROUND

Field of Invention

The present invention relates to storage circuits and operation methods, and more particularly, a memory array circuit, a ternary content addressable memory and an operating method thereof.

Description of Related Art

With the vigorous development of the semiconductor industry, semiconductor components are constantly being introduced. In many application fields, the ternary content addressable memory (TCAM) is widely used in various electronic products.

Traditionally, the ternary content addressable memory is usually implemented by two static random access memory (SRAM) cells with additional matching logic elements. However, SRAM-TCAM dose not only take up more than ten transistors to represent the search, but it is also energy-consuming due to the volatility of SRAM. Therefore, based on the above reasons, a new ternary content addressable memory is needed to solve the problems of the previous technology.

SUMMARY

In one or more various aspects, the present disclosure is directed to a memory array circuit, a ternary content addressable memory and an operating method thereof.

One embodiment of the present disclosure is related to a ternary content addressable memory, which includes a first memory unit and a second memory, and the second memory unit is electrically connected to the first memory unit. The first memory unit includes a control transistor and a first variable impedance passive component, where one end of the first variable impedance passive component is electrically connected to a gate of the control transistor. The second memory unit includes a data transistor and a second variable impedance passive component, and the data transistor connected in series to the control transistor, where one end of the second variable impedance passive component is electrically connected to a gate of the data transistor.

In one embodiment of the present disclosure, a source/drain of the control transistor is electrically connected to a bit line, another source/drain of the control transistor is electrically connected to a source/drain of the data transistor, the another source/drain of the control transistor and the source/drain of the data transistor are electrically connected to a match line, and another source/drain of the data transistor is electrically connected to a data line.

In one embodiment of the present disclosure, another end of the first variable impedance passive component is electrically connected to a control line, and another end of the second variable impedance passive component is electrically connected to a word line.

In one embodiment of the present disclosure, another end of the first variable impedance passive component and another end of the second variable impedance passive component are electrically connected to a word line.

In one embodiment of the present disclosure, each of the first variable impedance passive component and the second variable impedance passive component is a variable resistor, a variable capacitor or a capacitive component with an electron capturing capability and a fixed dielectric constant.

Another embodiment of the present disclosure is related to a memory array circuit, which includes a plurality of ternary content addressable memories arranged in an array, and each of the ternary content addressable memories includes a first memory unit and a second memory unit, the second memory unit is electrically connected to the first memory unit. The first memory unit includes a control transistor and a first variable impedance passive component, one end of the first variable impedance passive component is electrically connected to a gate of the control transistor. The second memory unit includes a data transistor and a second variable impedance passive component, the data transistor is connected in series to the control transistor, and one end of the second variable impedance passive component is electrically connected to a gate of the data transistor.

In one embodiment of the present disclosure, a source/drain of the control transistor is electrically connected to one of a plurality of bit lines, another source/drain of the control transistor is electrically connected to a source/drain of the data transistor, the another source/drain of the control transistor and the source/drain of the data transistor are electrically connected to one of a plurality of match lines, another source/drain of the data transistor is electrically connected to one of a plurality of data lines, the bit lines and the data lines are electrically connected to a first circuit, and the match lines are electrically connected to a second circuit.

In one embodiment of the present disclosure, another end of the first variable impedance passive component is electrically connected to one of a plurality of control lines, another end of the second variable impedance passive component is electrically connected one of a plurality of word lines, the word lines are electrically connected to a third circuit, and the control lines are electrically connected to a fourth circuit.

In one embodiment of the present disclosure, another end of the first variable impedance passive component and another end of the second variable impedance passive component are electrically connected to one of a plurality of word lines, and the word lines are electrically connected to a third circuit.

Another embodiment of the present disclosure is related to an operation method of a ternary content addressable memory, and the ternary content addressable memory includes a first memory unit and a second memory unit. The first memory unit includes a control transistor and a first variable impedance passive component, and one end of the first variable impedance passive component is electrically connected to a gate of the control transistor. The second memory unit includes a data transistor and a second variable impedance passive component, the data transistor is connected in series to the control transistor, and one end of the second variable impedance passive component is electrically connected to a gate of the data transistor. The operation method includes steps of: when searching the ternary content addressable memory, applying a working voltage to another end of the first variable impedance passive component and another end of the second variable impedance passive component, and reading a current value of a bit line to determine whether the first memory unit is in a care mode or a don't care mode, where a source/drain of the control transistor is electrically connected to the bit line, a channel resistance of the control transistor is a first resistance state in the don't care mode, the channel resistance of the control transistor is a third resistance state in the care mode, a channel resistance of the data transistor is a second resistance state or a fourth resistance state, the first resistance state is greater than the second resistance state, the second resistance state is greater than the third resistance state, and the third resistance state is greater than the fourth resistance state.

In one embodiment of the present disclosure, another source/drain of the control transistor is electrically connected to a source/drain of the data transistor, the another source/drain of the control transistor and the source/drain of the data transistor are electrically connected to a match line, another source/drain of the data transistor is electrically connected to a data line, and the operation method further includes when the first memory unit is in the care mode, applying a first voltage to the data line, applying a second voltage complementary to the first voltage to the bit line, and determining whether information stored in the second memory unit corresponds to a first search result or a second search result according to a voltage value of the match line, where the second search result is opposite to the first search result.

In one embodiment of the present disclosure, the channel resistance of the data transistor is the fourth resistance state. If the first voltage of the data line is a zero voltage and the second voltage of the bit line is a working voltage, the voltage value of the match line is a voltage lower than one-third of the working voltage, the information stored in the second memory unit corresponds to the first search result. If the first voltage of the data line is the working voltage and the second voltage of the bit line is the zero voltage, the voltage value of the match line is a voltage higher than one-third of the working voltage, and the information stored in the second memory unit corresponds to the second search result.

In one embodiment of the present disclosure, the channel resistance of the data transistor is the second resistance state. If the first voltage of the data line is a zero voltage and the second voltage of the bit line is a working voltage, the voltage value of the match line is a voltage higher than one-third of the working voltage, and the information stored in the second memory unit corresponds to the second search result. If the first voltage of the data line is the working voltage and the second voltage of the bit line is the zero voltage, the voltage value of the match line is a voltage lower than one-third of the working voltage, and the information stored in the second memory unit corresponds to the first search result.

In one embodiment of the present disclosure, the another end of the first variable impedance passive component is electrically connected to a control line, the another end of the second variable impedance passive component is electrically connected to a word line, and the step of applying the working voltage to the another end of the first variable impedance passive component and the another end of the second variable impedance passive component includes: applying the working voltage to the control line and the word line.

In one embodiment of the present disclosure, the operation method further includes: when programming the first memory unit, applying a programming voltage to the control line, floating the word line, floating the match line, applying a zero voltage to the bit line, and floating the data line; when programming the second memory unit, floating the control line, applying the programming voltage to the word line, floating the match line, floating the bit line, and applying the zero voltage to the data line.

In one embodiment of the present disclosure, the operation method further includes: when erasing the first memory unit, applying the zero voltage to the control line, floating the word line, floating the match line, applying an erase voltage to the bit line, and floating the data line; when erasing the second memory unit, floating the control line, applying the zero voltage to the word line, floating the match line, floating the bit line, and applying the erase voltage to the data line.

In one embodiment of the present disclosure, the operation method further includes: when reading the first memory unit, applying a read voltage to the control line, applying the zero voltage to the word line, applying the zero voltage to the match line, applying a test voltage to the bit line, and applying the zero voltage to the data line; when reading the second memory unit, applying the zero voltage to the control line, applying the read voltage to the word line, applying the zero voltage to the match line, applying the zero voltage to the bit line, and applying the test voltage to the data line.

In one embodiment of the present disclosure, the another end of the first variable impedance passive component and the another end of the second variable impedance passive component are electrically connected to a word line. The step of applying the working voltage to the another end of the first variable impedance passive component and the another end of the second variable impedance passive component includes: applying the working voltage to the word line.

In one embodiment of the present disclosure, the operation method further includes: when programming the first memory unit and the second memory unit, applying a programming voltage to the word line, floating the match line, applying a zero voltage to the bit line, and applying the zero voltage to the data line; when erasing the first memory unit, applying the zero voltage to the word line, floating the match line, applying an erase voltage to the bit line, and floating the data line; when erasing the second memory unit, applying the zero voltage to the word line, floating the match line, floating the bit line, and applying the erase voltage to the data line.

In one embodiment of the present disclosure, the operation method further includes: when reading the first memory unit, applying a read voltage to the word line, floating the match line, applying a test voltage to the bit line, and applying the zero voltage to the data line; when reading the second memory unit, applying the read voltage to the word line, floating the match line, applying the zero voltage to the bit line, and applying the test voltage to the data line.

Technical advantages are generally achieved, by embodiments of the present disclosure. With the technical solution of the present disclosure, the ternary content addressable memory is a non-volatile ternary content addressable memory, which has high stability, a wide memory window, and saves energy consumption.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows:

FIG. 3 is a table illustrating setting, resetting and reading operations in an operation method of a ternary content addressable memory according to one embodiment of the present disclosure;

FIG. 4 is a table illustrating searching operations in an operation method of a ternary content addressable memory according to one embodiment of the present disclosure;

FIG. 5 is a table illustrating setting, resetting and reading operations in an operation method of a ternary content addressable memory according to another embodiment of the present disclosure;

FIG. 6 is a table illustrating searching operations in an operation method of a ternary content addressable memory according to another embodiment of the present disclosure;

DETAILED DESCRIPTION

Figure 1:
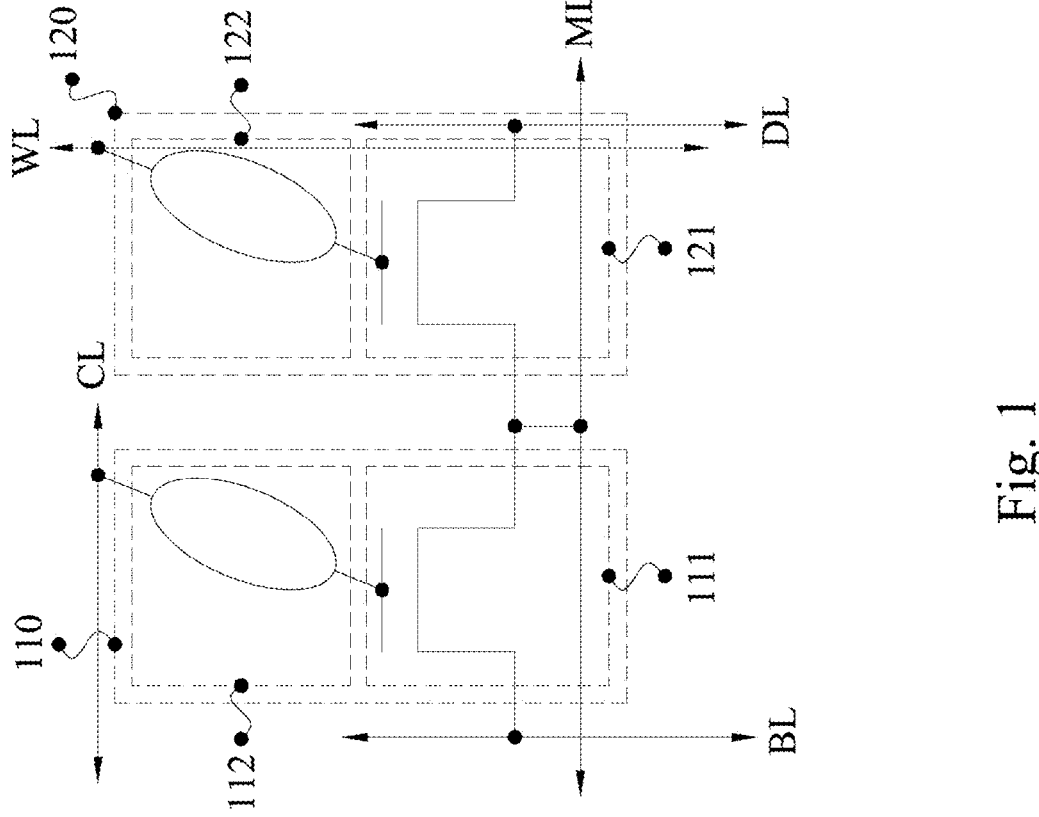
FIG. 1 is a circuit diagram of a ternary content addressable memory according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
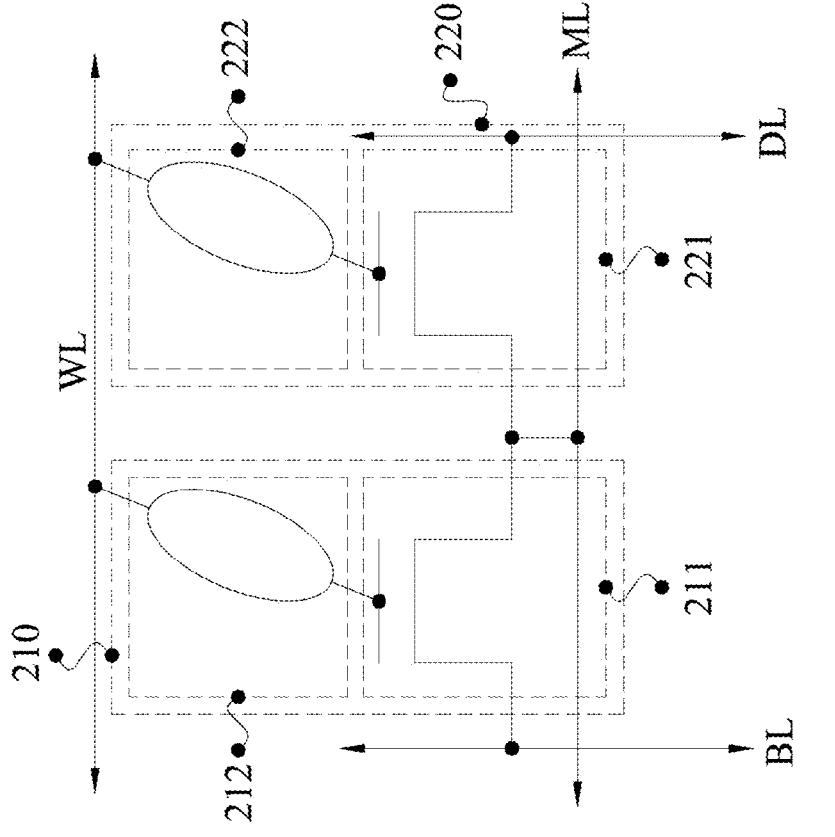
FIG. 2 is a circuit diagram of a ternary content addressable memory according to another embodiment of the present disclosure.

Referring to FIGS. 1-2, in one aspect, the present disclosure is directed to ternary content addressable memories 100 and 200. This ternary content addressable memory plays an important role in data-searching-and-matching in modern digital computing architectures and may be applicable or readily adaptable to all technologies. Accordingly, the ternary content addressable memories 100 and 200 have advantages. Herewith the ternary content addressable memories 100 and 200 are described below with FIGS. 1-2.

The subject disclosure provides the ternary content addressable memories 100 and 200 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a circuit diagram of a ternary content addressable memory 100 according to one embodiment of the present disclosure. As shown in FIG. 1, the ternary content addressable memory 100 includes first memory unit 110 and second memory unit 120. Architecturally, the second memory unit 120 is electrically connected to the first memory unit 110. In use, the first memory unit 110 is used for control, and the second memory unit 120 is used for data storage and search. Specifically, the first memory unit 110 controls the "Care" and "Don't Care" modes; the second memory unit 120 stores some content that needs to be matched.

Moreover, it should be noted that in the embodiments and the scope of the present disclosure, the description related to "electrical connection" can generally refer to one component being indirectly electrically coupled to another component through intervening components, or a component is directly electrically connected to another component, there are no intervening components present.

In FIG. 1, the first memory unit 110 includes a control transistor 111 and a first variable impedance passive component 112. Architecturally, one end of the first variable impedance passive component 112 is electrically connected to the gate of the control transistor 111. Similarly, the second memory unit 120 includes a data transistor 121 and a second variable impedance passive component 122. Architecturally, the data transistor 121 is connected in series to the control transistor 111, and one end of second variable impedance passive component 122 is electrically connected to the gate of the data transistor 121. In practice, for example, in the embodiment of FIG. 1, the control transistor 111 and the data transistor 121 of FIG. 1 can be N-type field effect transistors; alternatively, in another embodiment, the control transistor 111 and the data transistor 121 can be P-type field effect transistors. Those with ordinary skill in the art may choose suitable field effect transistors depending on the desired application.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

In FIG. 1, a source/drain of the control transistor 111 is electrically connected to a bit line BL, another source/drain of the control transistor 111 is electrically connected to a source/drain of the data transistor 121, and said another source/drain of the control transistor 111 and the source/drain of the data transistor 121 are electrically connected to a match line ML. Another source/drain of the data transistor 121 is electrically connected to a data line DL.

In FIG. 1, in some embodiments of the present disclosure, another end of the first variable impedance passive component 112 is electrically connected to a control line CL, and another end of the second variable impedance passive component 122 is electrically connected to a word line WL. Different variable impedance passive components are connected to the control line CL and the word line WL respectively, so as to facilitate subsequent programming operations for the first memory unit 110 and the second memory unit 120 respectively.

In FIG. 1, in some embodiments of the present disclosure, each of the first variable impedance passive component 112 and the second variable impedance passive component 122 can be a variable resistor, a variable capacitor (e.g., a ferroelectric capacitor), a capacitive components with the electron capture capability and the fixed dielectric constant (e.g., floating gate materials in flash memory) or other materials with variable storage properties.

In view of the above, the present disclosure adopts the first variable impedance passive component 112 and the second variable impedance passive component 122, so that the ternary content addressable memory 100 can be used as a non-volatile ternary content addressable memory, which has high stability, a wide memory window, and saves energy consumption.

In a controlled experiment, spin-torque-transfer magnetic-random-access-memory (STT-MRAM) can be used as ternary content addressable memory, but the narrower memory window between the state—"0" and "1" worsens signal-integrity; also, the larger programming current enlarges searching-power.

In a controlled experiment, a transistor was paired with a resistive random-access memory (RRAM) can be used as a ternary content addressable memory. However, limited endurance cycles, and an insufficient memory window of the RRAM become inevitable issues.

FIG. 2 is a circuit diagram of a ternary content addressable memory 200 according to another embodiment of the present disclosure. As shown in FIG. 2, the ternary content addressable memory 200 includes a first memory unit 210 and a second memory unit 220. Architecturally, the second memory unit 220 is electrically connected to the first memory unit 210.

In FIG. 2, the first memory unit 210 includes a control transistor 211 and a first variable impedance passive component 212. Architecturally, one end of the first variable impedance passive component 212 is electrically connected to the gate of the control transistor 211. Similarly, the second memory unit 220 includes a data transistor 221 and a second variable impedance passive component 222. Architecturally, the data transistor 221 is connected in series to the control transistor 211, and one end of the second variable impedance passive component 222 is electrically connected to the gate of the data transistor 221. In practice, for example, in the embodiment of FIG. 2, the control transistor 211 and the data transistor 221 of FIG. 2 can be N-type field effect transistors; alternatively, in another embodiment, the control transistor 211 and the data transistor 221 can be P-type field effect transistors. Those with ordinary skill in the art may choose suitable field effect transistors depending on the desired application.

In FIG. 2, a source/drain of the control transistor 211 is electrically connected to a bit line BL, another source/drain of the control transistor 211 is electrically connected to a source/drain of the data transistor 221, and said another source/drain of the control transistor 211 and the source/drain of the data transistor 221 are electrically connected to match line ML, Another source/drain of the data transistor 221 is electrically connected to a data line DL.

In FIG. 2, in some embodiments of the present disclosure, another end of the first variable impedance passive component 212 and another end of the second variable impedance passive component 222 are electrically connected to a word line WL. Because the first variable impedance passive component 212 and the second variable impedance passive component 222 share the same word line WL, the ternary content addressable memory 200 occupies a smaller area.

For a more complete understanding of the operation method of the ternary content addressable memory 100, refer to FIG. 1 and FIG. 3. FIG. 3 is a table illustrating setting, resetting and reading operations in an operation method of the ternary content addressable memory 100 according to one embodiment of the present disclosure.

In the stage of setting the ternary content addressable memory 100, when programming the first memory unit 110, the programming voltage VPGM (e.g., about 2V-4V) is applied to the control line CL, the word line WL is floated, and the match line ML is floated, a zero voltage (e.g., about 0V) is applied to the bit line BL, and the data line DL is floated. Similarly, when programming the second memory unit 120, the control line CL is floated, the programming voltage VPGM is applied to the word line WL, the match line ML is floated, the bit line BL is floated, and the zero voltage is applied to the data line DL.

In the stage of resetting the ternary content addressable memory 100, when erasing the first memory unit 110, the zero voltage is applied to the control line CL, the word line WL is floated, the match line ML is floated, and an erase voltage $V_{ERS}$ (e.g., about 2V-4V) is applied to the bit line BL, the data line DL is floated. Similarly, when erasing the second memory unit 120, the control line CL is floated, the zero voltage is applied to the word line WL, the match line ML is floated, the bit line BL is floated, and the erase voltage $V_{ERS}$ is applied to the data line DL.

In the stage of reading the ternary content addressable memory 100, when reading the first memory unit 110, the read voltage $V_{READ}$ (e.g., about 0.8V) is applied to the control line CL, the zero voltage is applied to the word line WL, the zero voltage is applied to the match line ML, a test voltage $V_{TEST}$ (e.g., about 0.3V) is applied to the bit line BL, and the zero voltage is applied to the data line DL. Similarly, when reading the second memory unit 120, the zero voltage is applied to the control line CL, the read voltage $V_{READ}$ is applied to the word line WL, the zero voltage is applied to the match line ML, the zero voltage is applied to the bit line BL, and the test voltage $V_{TEST}$ is applied to the data line DL.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

For a more complete understanding of the operation method of the ternary content addressable memory 200, refer to FIG. 2 and FIG. 5. FIG. 5 is a table illustrating setting, resetting and reading operations in an operation method of the ternary content addressable memory 200 according to another embodiment of the present disclosure.

In the stage of setting the ternary content addressable memory 200, when programming the first memory unit 210 and the second memory unit 220, the programming voltage VPGM (e.g., about 1.5V-4V) is applied to the word line WL, the match line ML is floated, the zero voltage is applied to the bit line BL, and the zero voltage is applied to the data line DL. Since the first memory unit 210 and the second memory unit 220 share the same word line WL, the first memory unit 210 and the second memory unit 220 can be jointly programmed to the same storage content, and then the first memory unit 210 and the second memory unit 220 can be erased in different degrees respectively, so that the storage content of the first memory unit 210 can be different from the storage content of the second memory unit 220.

In the stage of resetting the ternary content addressable memory 200, when erasing the first memory unit 210, the zero voltage is applied to the word line WL, the match line ML is floated, and an erase voltage $V_{ERS}$ (e.g., about 1.5V-4V) is applied to the bit line BL, and the data line DL is floated. Similarly, when erasing the second memory unit 220, the zero voltage is applied to the word line WL, the match line ML is floated, the bit line BL is floated, and the erase voltage $V_{ERS}$ (e.g., about 1.5V-4V) is applied to the data line DL.

In the stage of reading the ternary content addressable memory 200, when reading the first memory unit 210, a read voltage $V_{READ}$ (e.g., about 0.8V-1.2V) is applied to the word line WL, the match line ML is floated, a test voltage $V_{TEST}$ (e.g., about 0.3V-1V) is applied to the bit line BL, and the zero voltage is applied to the data line DL. Similarly, when reading the second memory unit 220, the read voltage $V_{READ}$ is applied to the word line WL, the match line ML is floated, the zero voltage is applied to the bit line BL, and the test voltage $V_{TEST}$ is applied to the data line DL.

For a more complete understanding of searching operations of the operation method of the ternary content addressable memory 100, please refer to FIG. 1, FIG. 3, and FIG. 4. FIG. 4 is a table illustrating searching operations in the operation method of the ternary content addressable memory 100 according to one embodiment of the present disclosure. In FIG. 1, one end of the first variable impedance passive component 112 is electrically connected to the gate of the control transistor 111, and one end of the second variable impedance passive component 122 is electrically connected to the gate of the data transistor 121.

When searching the ternary content addressable memory 100, a working voltage $V_{dd}$ is applied to another end of the first variable impedance passive component 112 and another end of the second variable impedance passive component 122, and a current value of the bit line BL is read to determine whether first memory unit 110 is in a care mode or a don't care mode, in which a source/drain of the control transistor 111 is electrically connected to bit line BL.

Regarding the specific mechanism for applying the working voltage $V_{dd}$, in some embodiments of the present disclosure, another end of the first variable impedance passive component 112 is electrically connected to the control line CL, and another end of the second variable impedance passive component 122 is electrically connected to the word line WL. The step of applying working voltage $V_{dd}$ to another end of first variable impedance passive component 112 and another end of second variable impedance passive component 122 can include: applying the working voltage $V_{dd}$ to the control line CL and the word line WL.

Regarding the specific method of determining whether the first memory unit 110 is in the care mode or the don't care mode, in some embodiments of the present disclosure, if the current value of the bit line BL is greater than the preset current threshold, then the first memory unit 110 is in the care mode; on the contrary, if the current value of the bit line BL (e.g., approaching zero current) is less than or equal to the preset current threshold, the first memory unit 110 is in the don't care mode. In practice, for example, the preset current threshold can be set based on actual experience or experimental data.

In the don't care mode, the channel resistance $R_{ctr}$ of the control transistor 111 is a first resistance state GRS, and the channel resistance $R_{data}$ of the data transistor 121 is a second resistance state HRS or a fourth resistance state LRS. In the care mode, the channel resistance $R_{ctr}$ of the control transistor 111 is a third resistance state MRS, and the channel resistance $R_{data}$ of the data transistor 121 is the second resistance state HRS or the fourth resistance state LRS. The first resistance state GRS is greater than the second resistance state HRS, the second resistance state HRS is greater than the third resistance state MRS, and the third resistance state MRS is greater than the fourth resistance state LRS.

In practice, for example, after the first variable impedance passive component 112 is programmed or erased, the resistance state of the channel resistance $R_{ctr}$ of the control transistor 111 is affected during operation. Similarly, after the second variable impedance passive component 122 is programmed or erased, the resistance state of the channel resistance $R_{data}$ of the data transistor 121 is affected during operation.

Then, when the first memory unit 110 is in the care mode, a first voltage is applied to the data line DL, a second voltage complementary to the first voltage is applied to the bit line BL, and whether the information stored in second memory unit 120 corresponds to the first search result or the second search result is determined according to a voltage value of the match line ML, where the second search result is opposite to the first search result. In some embodiments of the present disclosure, the first search result is a matched result, and the second search result is a mismatched result. Alternatively, it can also be reversely defined, in some embodiments of the present disclosure, the first search result is a mismatched result, and the second search result is a matched result.

In some embodiments of the present disclosure, the channel resistance $R_{data}$ of the data transistor 121 is the fourth resistance state LRS. If the first voltage of the data line DL is about zero voltage (0V) and the second voltage of bit line BL is about working voltage $V_{dd}$, the voltage value of the match line ML is approximately zero voltage, and the information stored in the second memory unit 120 corresponds to the first search result; conversely, if the first voltage of the data line DL is approximately working voltage $V_{dd}$ and the second voltage of the bit line BL is approximately zero voltage (0V), the voltage value of the match line ML is a voltage about higher than one-third of the working voltage $V_{dd}$ or about the working voltage $V_{dd}$, and the information stored in the second memory unit 120 corresponds to the second search result.

Alternatively, in some embodiments of the present disclosure, the channel resistance $R_{data}$ of the data transistor 121 is the second resistance state HRS. If the first voltage of the data line DL is about zero voltage and the second voltage of the bit line BL is about the working voltage $V_{dd}$, the voltage value of the match line ML is a voltage about higher than one-third of the working voltage $V_{dd}$ or about the working voltage $V_{dd}$, and the information stored in the second memory unit 120 corresponds to the second search result; conversely, if the first voltage of the data line DL is about the working voltage $V_{dd}$ and the second voltage of the bit line BL is about zero voltage, the voltage value of match line ML is a voltage about lower than one-third of the working voltage $V_{dd}$ or about zero voltage, and the information stored in the second memory unit 120 corresponds to the first search result.

For a more complete understanding of searching operations of the operation method of the ternary content addressable memory 200, please refer to FIG. 2, FIG. 5, and FIG. 6. FIG. 6 is a table illustrating searching operations in the operation method of the ternary content addressable memory 200 according to another embodiment of the present disclosure. In FIG. 2, one end of the first variable impedance passive component 212 is electrically connected to the gate of the control transistor 211, and one end of the second variable impedance passive component 222 is electrically connected to the gate of the data transistor 221.

When searching the ternary content addressable memory 200, the working voltage $V_{dd}$ is applied to another end of first variable impedance passive component 212 and another end of second variable impedance passive component 222, and the current value of the bit line BL is read to determine whether first memory unit 210 is in the care mode or the don't care mode, in which a source/drain of the control transistor 211 is electrically connected to the bit line BL.

Regarding the specific mechanism for applying the working voltage $V_{dd}$, another end of the first variable impedance passive component 212 and another end of the second variable impedance passive component 222 are electrically connected to word line WL, and the step of applying the working voltage $V_{dd}$ to another end of first variable impedance passive component 212 and another end of second variable impedance passive component 222 includes: applying working voltage $V_{dd}$ to the word line WL.

Regarding the specific method of determining whether the first memory unit 210 is in the care mode or the don't care mode, in some embodiments of the present disclosure, if the current value of the bit line BL is greater than the preset current threshold, the first memory unit 210 is in the care mode; on the contrary, if the current value of the bit line BL (e.g., approaching zero current) is less than or equal to the preset current threshold, the first memory unit 210 is in the don't care mode. In practice, for example, the preset current threshold can be set based on actual experience or experimental data.

In the don't care mode, the channel resistance $R_{ctr}$ of the control transistor 211 is the first resistance state GRS, and the channel resistance $R_{data}$ of the data transistor 221 is the second resistance state HRS or the fourth resistance state LRS. In the care mode, the channel resistance $R_{ctr}$ of the control transistor 211 is the third resistance state MRS, and the channel resistance $R_{data}$ of the data transistor 221 is the second resistance state HRS or the fourth resistance state LRS. The first resistance state GRS is greater than the second resistance state HRS, the second resistance state HRS is greater than the third resistance state MRS, and the third resistance state MRS is greater than the fourth resistance state LRS.

In practice, for example, after the first variable impedance passive component 212 is programmed or erased, the resistance state of the channel resistance $R_{ctr}$ of the control transistor 211 is affected during operation. Similarly, after the second variable impedance passive component 222 is programmed or erased, the resistance state of the channel resistance $R_{data}$ of the data transistor 221 is affected during operation.

Then, when the first memory unit 210 is in the care mode, a first voltage is applied to the data line DL, a second voltage complementary to the first voltage is applied to the bit line BL, and whether the information stored in second memory unit 220 corresponds to the first search result or the second search result is determined according to the voltage value of the match line ML, where the second search result is opposite to the first search result. In some embodiments of the present disclosure, the first search result is a matched result, and the second search result is a mismatched result. Alternatively, it can also be reversely defined, in some embodiments of the present disclosure, the first search result is a mismatched result, and the second search result is a matched result.

In some embodiments of the present disclosure, the channel resistance $R_{data}$ of the data transistor 221 is the fourth resistance state LRS. If the first voltage of the data line DL is about zero voltage (0V) and the second voltage of the bit line BL is about working voltage $V_{dd}$, the voltage value of match line ML is approximately zero voltage, and the information stored in the second memory unit 220 corresponds to the first search result; conversely, if the first voltage of the data line DL is approximately working voltage $V_{dd}$ and the second voltage of the bit line BL is approximately zero voltage (0V), the voltage value of match line ML is approximately working voltage $V_{dd}$, and the information stored in the second memory unit 220 corresponds to the second search result.

Alternatively, in some embodiments of the present disclosure, the channel resistance $R_{data}$ of the data transistor 221 is the second resistance state HRS. If the first voltage of the data line DL is about zero voltage and the second voltage of the bit line BL is about the working voltage $V_{dd}$, the voltage value of the match line ML is approximately working voltage $V_{dd}$, and the information stored in the second memory unit 220 corresponds to the second search result; conversely, if the first voltage of the data line DL is approximately working voltage $V_{dd}$ and the second voltage of the bit line BL is approximately zero voltage, the voltage value of match line ML is approximately zero voltage, and the information stored in the second memory unit 220 corresponds to the first search result.

Figure 7:
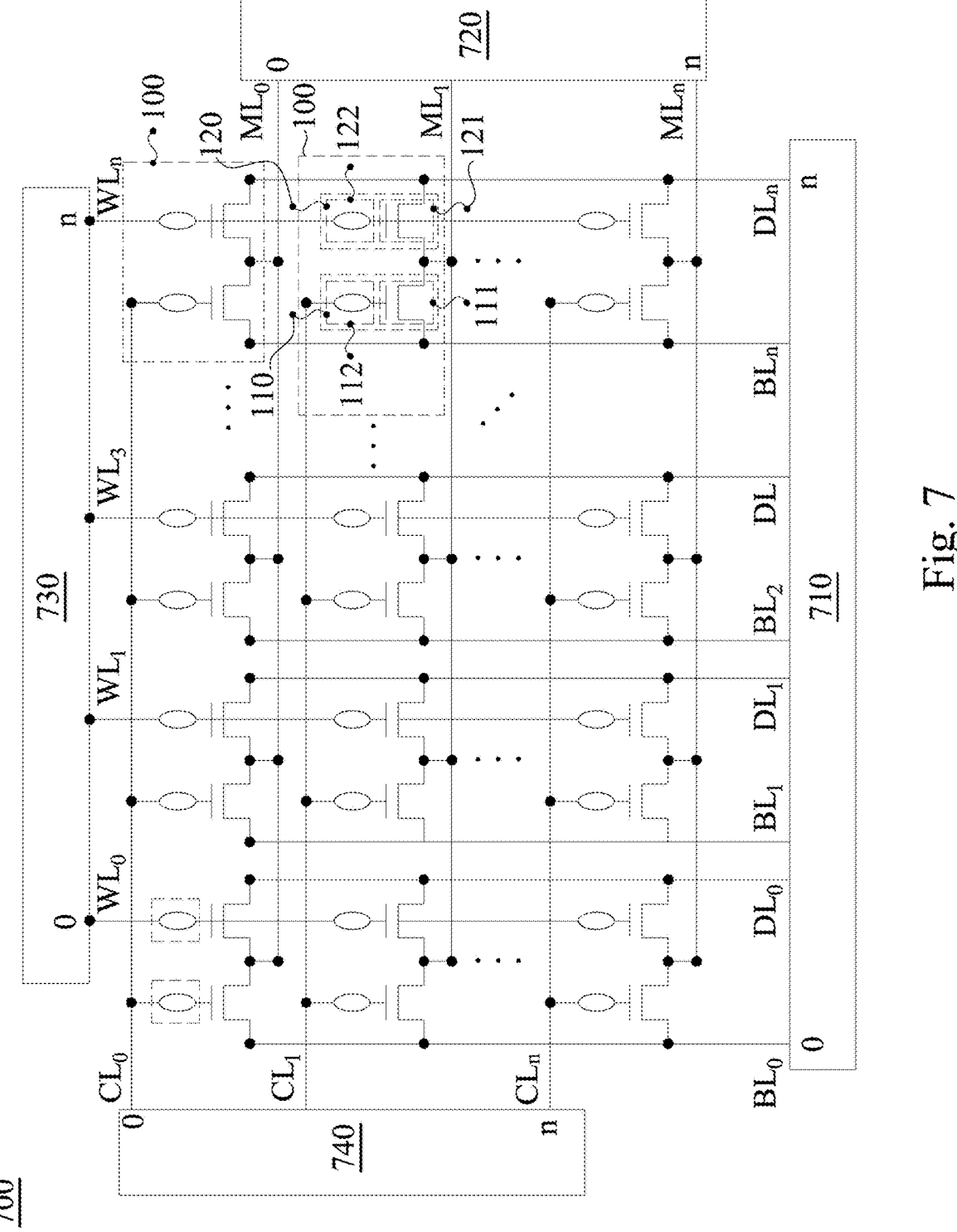
FIG. 7 is an equivalent circuit diagram of a memory array circuit according to one embodiment of the present disclosure.

FIG. 7 is an equivalent circuit diagram of a memory array circuit 700 according to one embodiment of the present disclosure. As shown in FIG. 7, the memory array circuit 700 includes a plurality of ternary content addressable memories 100 arranged in an array. Each of the plurality of ternary content addressable memories 100 includes a first memory unit 110 and a second memory unit 120. The second memory unit 120 is electrically connected to the first memory unit 110. The first memory unit 110 includes the control transistor 111 and the first variable impedance passive component 112. One end of the first variable impedance passive component 112 is electrically connected to the gate of the control transistor 111. Similarly, the second memory unit 120 includes the data transistor 121 and the second variable impedance passive component 122. The data transistor 121 is connected in series to the control transistor 111, one end of second variable impedance passive component 122 is electrically connected to the gate of data transistor 121.

In FIG. 7, a source/drain of the control transistor 111 is electrically connected to one of the plurality of bit lines $BL_0$-$BL_n$, and another source/drain of the control transistor 111 is electrically connected to a source/drain of the data transistor 121. Said another source/drain of the control transistor 111 and the source/drain of data transistor 121 are electrically connected to one of a plurality of match lines $ML_0$-$ML_n$, and another source/drain of the data transistor 121 is electrically connected to one of a plurality of data lines $DL_0$-$DL_n$. The bit lines $BL_0$-$BL_n$ and the data lines $DL_0$-$DL_n$ are electrically connected to a first circuit 710, and the match lines $ML_0$-$ML_n$ are electrically connected to a second circuit 720.

In some embodiments of the present disclosure, the first circuit 710 can include a bit line driver, a data line driver, a control circuit, a peripheral circuit, and a sensing amplifier. In use, the control circuit controls the bit line driver to apply a suitable voltage (e.g., the erase voltage, the test voltage, the zero voltage, floating connection and so on) to the bit line, and the control circuit controls the data line driver to apply a suitable voltage (e.g., the erase voltage, the test voltage, the zero voltage, the floating connection and so on) to the data line, the sensing amplifier can sense the current value on the bit line, and the control circuit can determine the care or don't care mode based on the current value.

In some embodiments of the present disclosure, the second circuit 720 can include a match line driver, a control circuit, a peripheral circuit, and a reading circuit. In use, the control circuit controls the match line driver to apply a suitable voltage (e.g., the zero voltage, the floating connection and so on) to the match line. The reading circuit can read the voltage value on the match line, and the control circuit can determine the search result according to the voltage value.

In FIG. 7, another end of the first variable impedance passive component 112 is electrically connected to one of a plurality of control lines $CL_0$-$CL_n$, and another end of the second variable impedance passive component 122 is electrically connected to one of a plurality of word lines $WL_0$-$WL_n$. The word lines $WL_0$-$WL_0$ are electrically connected to a third circuit 730, and the control lines $CL_0$-$CL_n$ are electrically connected to a fourth circuit 740.

In some embodiments of the present disclosure, the third circuit 730 can include a word line driver, a control circuit, and peripheral circuits. In use, the control circuit controls the word line driver to apply a suitable voltage (e.g., the programming voltage, the read voltage, the zero voltage, the floating connection, and so on) to the word line.

In some embodiments of the present disclosure, the fourth circuit 740 can include a control line driver, a control circuit, and peripheral circuits. In use, the control circuit controls the control line driver to apply a suitable voltage (e.g., the programming voltage, the read voltage, the zero voltage, the floating connection, and so on) to the control line.

Figure 8:
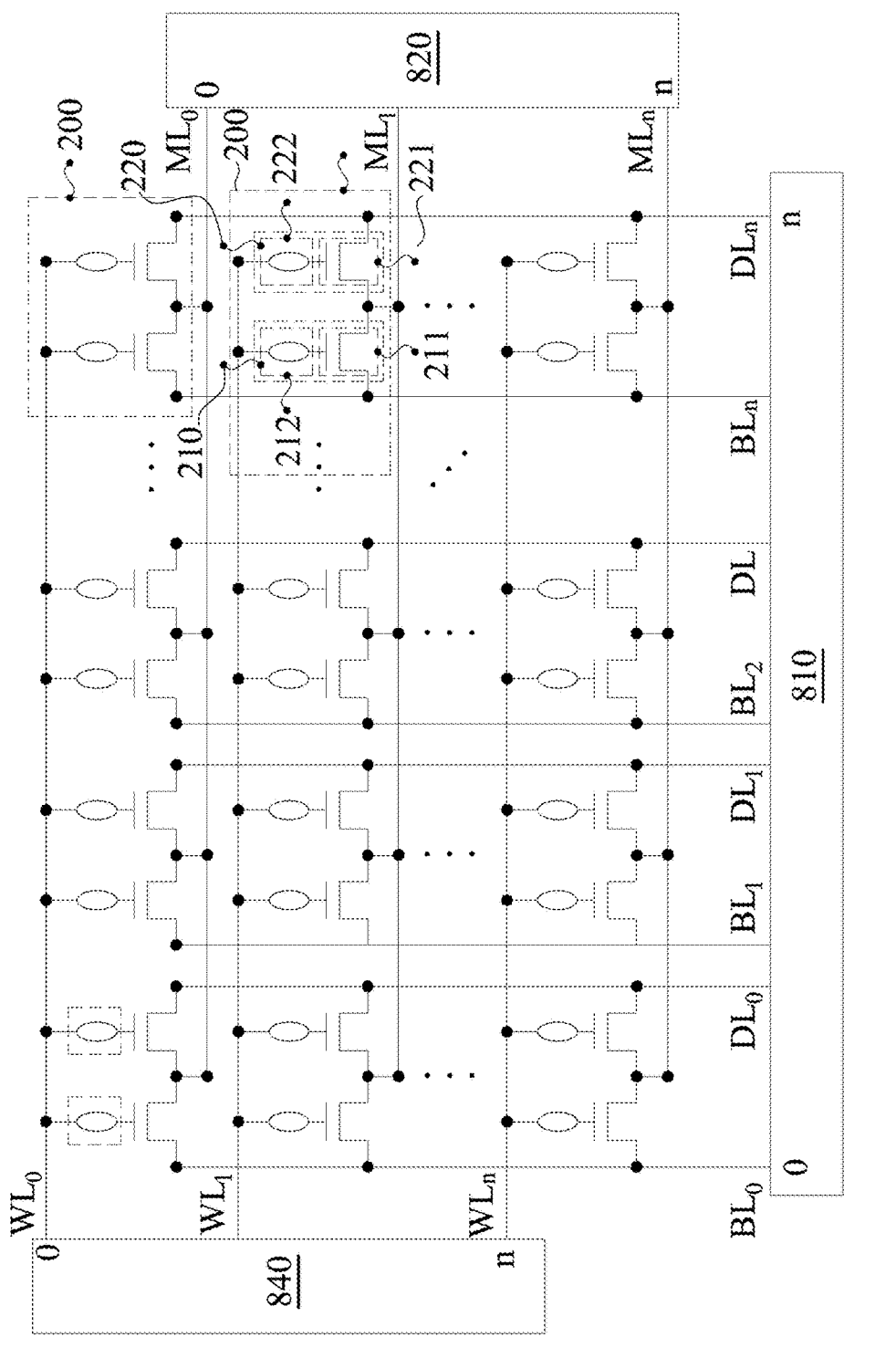
FIG. 8 is an equivalent circuit diagram of a memory array circuit according to another embodiment of the present disclosure.

FIG. 8 is an equivalent circuit diagram of a memory array circuit 800 according to another embodiment of the present disclosure. As shown in FIG. 8, the memory array circuit 800 includes a plurality of ternary content addressable memories 200 arranged in an array. Each of the plurality of ternary content addressable memories 200 includes a first memory unit 210 and a second memory unit 220. The second memory unit 220 is electrically connected to the first memory unit 210. The first memory unit 210 includes the control transistor 211 and the first variable impedance passive component 212. One end of the first variable impedance passive component 212 is electrically connected to the gate of the control transistor 211. Similarly, the second memory unit 220 includes the data transistor 221 and the second variable impedance passive component 222. The data transistor 221 is connected in series to the control transistor 211, and one end of second variable impedance passive component 222 is electrically connected to the gate of data transistor 221.

In FIG. 8, a source/drain of the control transistor 211 is electrically connected to one of a plurality of bit lines $BL_0$-$BL_n$, and another source/drain of the control transistor 211 is electrically connected to a source/drain of the data transistor 221. Said another source/drain of the control transistor 211 and the source/drain of data transistor 221 are electrically connected to one of a plurality of match lines $ML_0$-$ML_n$, and another source/drain of the data transistor 221 is electrically connected to one of a plurality of data lines $DL_0$-$DL_n$. The bit lines $BL_0$-$BL_n$ and the data lines $DL_0$-$DL_n$ are electrically connected to a first circuit 810, and the match lines $ML_0$-$ML_n$ are electrically connected with a second circuit 820.

In some embodiments of the present disclosure, the first circuit 810 can include a bit line driver, a data line driver, a control circuit, a peripheral circuit, and a sensing amplifier. In use, the control circuit controls the bit line driver to apply a suitable voltage (e.g., the erase voltage, the test voltage, the zero voltage, the floating connection and so on) to the bit line, and the control circuit controls the data line driver to apply a suitable voltage (e.g., the erase voltage, the test voltage, the zero voltage, the floating connection and so on) to the data line. The sensing amplifier can sense the current value on the bit line, and the control circuit can determine the care or don't care mode based on the current value.

In some embodiments of the present disclosure, the second circuit 820 can include a match line driver, a control circuit, a peripheral circuit, and a reading circuit. In use, the control circuit controls the match line driver to apply a suitable voltage (e.g., the zero voltage, the floating connection, and so on) to the match line. The reading circuit can read the voltage value on the match line, and the control circuit can determine the search result according to the voltage value.

In FIG. 8, another end of the first variable impedance passive component 212 and another end of the second variable impedance passive component 222 are electrically connected to one of a plurality of word lines $WL_0$-$WL_0$, and the word lines $WL_0$-$WL_0$ are electrically connected to a third circuit 830.

In some embodiments of the present disclosure, the third circuit 830 can include a word line driver, a control circuit, and peripheral circuits. In use, the control circuit controls the word line driver to apply a suitable voltage (e.g., the programming voltage, the read voltage, the zero voltage, and so on) to the word line.

In view of the above, technical advantages are generally achieved, by embodiments of the present disclosure. With the technical solution of the present disclosure, the ternary content addressable memory 100 or 200 is a non-volatile ternary content addressable memory, which has high stability, a wide memory window, and saves energy consumption.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A ternary content addressable memory, comprising:
a first memory unit comprising a control transistor and a first variable impedance passive component, wherein one end of the first variable impedance passive component is electrically connected to a gate of the control transistor; and
a second memory unit electrically connected to the first memory unit, the second memory unit comprising a data transistor and a second variable impedance passive component, and the data transistor connected in series to the control transistor, wherein one end of the second variable impedance passive component is electrically connected to a gate of the data transistor,
wherein a source/drain of the control transistor is electrically connected to a bit line, another source/drain of the control transistor is electrically connected to a source/drain of the data transistor, the another source/drain of the control transistor and the source/drain of the data transistor are electrically connected to a match line, and another source/drain of the data transistor is electrically connected to a data line.

2. The ternary content addressable memory of claim 1, wherein another end of the first variable impedance passive component is electrically connected to a control line, and another end of the second variable impedance passive component is electrically connected to a word line.

3. The ternary content addressable memory of claim 1, wherein another end of the first variable impedance passive component and another end of the second variable impedance passive component are electrically connected to a word line.

4. The ternary content addressable memory of claim 1, wherein each of the first variable impedance passive component and the second variable impedance passive component is a variable resistor, a variable capacitor or a capacitive component with an electron capturing capability and a fixed dielectric constant.

5. A memory array circuit, comprising:

a plurality of ternary content addressable memories arranged in an array, and each of the ternary content addressable memories comprising:

a first memory unit comprising a control transistor and a first variable impedance passive component, wherein one end of the first variable impedance passive component is electrically connected to a gate of the control transistor; and a second memory unit electrically connected to the first memory unit, the second memory unit comprising a data transistor and a second variable impedance passive component, and the data transistor connected in series to the control transistor, wherein one end of the second variable impedance passive component is electrically connected to a gate of the data transistor, wherein a source/drain of the control transistor is electrically connected to one of a plurality of bit lines, another source/drain of the control transistor is electrically connected to a source/drain of the data transistor, the another source/drain of the control transistor and the source/drain of the data transistor are electrically connected to one of a plurality of match lines, another source/drain of the data transistor is electrically connected to one of a plurality of data lines, the bit lines and the data lines are electrically connected to a first circuit, and the match lines are electrically connected to a second circuit.

6. The memory array circuit of claim 5, wherein another end of the first variable impedance passive component is electrically connected to one of a plurality of control lines, another end of the second variable impedance passive component is electrically connected one of a plurality of word lines, the word lines are electrically connected to a third circuit, and the control lines are electrically connected to a fourth circuit.

7. The memory array circuit of claim 5, wherein another end of the first variable impedance passive component and another end of the second variable impedance passive component are electrically connected to one of a plurality of word lines, and the word lines are electrically connected to a third circuit.

8. An operation method of a ternary content addressable memory, the ternary content addressable memory comprising a first memory unit and a second memory unit, the first memory unit comprising a control transistor and a first variable impedance passive component, one end of the first variable impedance passive component being electrically connected to a gate of the control transistor, the second memory unit comprising a data transistor and a second variable impedance passive component, the data transistor connected in series to the control transistor, one end of the second variable impedance passive component being electrically connected to a gate of the data transistor, and the operation method comprising steps of:

when searching the ternary content addressable memory, applying a working voltage to another end of the first variable impedance passive component and another end of the second variable impedance passive component, and reading a current value of a bit line to determine whether the first memory unit is in a care mode or a don't care mode, wherein a source/drain of the control transistor is electrically connected to the bit line, a channel resistance of the control transistor is a first resistance state in the don't care mode, the channel resistance of the control transistor is a third resistance state in the care mode, a channel resistance of the data transistor is a second resistance state or a fourth resistance state, the first resistance state is greater than the second resistance state, the second resistance state is greater than the third resistance state, and the third resistance state is greater than the fourth resistance state.

9. The operation method of claim 8, wherein another source/drain of the control transistor is electrically connected to a source/drain of the data transistor, the another source/drain of the control transistor and the source/drain of the data transistor are electrically connected to a match line, another source/drain of the data transistor is electrically connected to a data line, and the operation method further comprising:

when the first memory unit is in the care mode, applying a first voltage to the data line, applying a second voltage complementary to the first voltage to the bit line, and determining whether information stored in the second memory unit corresponds to a first search result or a second search result according to a voltage value of the match line, wherein the second search result is opposite to the first search result.

10. The operation method of claim 9, wherein the channel resistance of the data transistor is the fourth resistance state, if the first voltage of the data line is a zero voltage and the second voltage of the bit line is a working voltage, the voltage value of the match line is the zero voltage, the information stored in the second memory unit corresponds to the first search result, if the first voltage of the data line is the working voltage and the second voltage of the bit line is the zero voltage, the voltage value of the match line is a voltage higher than one-third of the working voltage, and the information stored in the second memory unit corresponds to the second search result.

11. The operation method of claim 9, wherein the channel resistance of the data transistor is the second resistance state, if the first voltage of the data line is a zero voltage and the second voltage of the bit line is a working voltage, the voltage value of the match line is a voltage higher than one-third of the working voltage, and the information stored in the second memory unit corresponds to the second search result, if the first voltage of the data line is the working voltage and the second voltage of the bit line is the zero voltage, the voltage value of the match line is a voltage lower than one-third of the working voltage, and the information stored in the second memory unit corresponds to the first search result.

12. The operation method of claim 9, wherein the another end of the first variable impedance passive component is electrically connected to a control line, the another end of the second variable impedance passive component is electrically connected to a word line, and the step of applying the working voltage to the another end of the first variable impedance passive component and the another end of the second variable impedance passive component comprising:

applying the working voltage to the control line and the word line.

13. The operation method of claim 12, further comprising:

when programming the first memory unit, applying a programming voltage to the control line, floating the word line, floating the match line, applying a zero voltage to the bit line, and floating the data line; and when programming the second memory unit, floating the control line, applying the programming voltage to the word line, floating the match line, floating the bit line, and applying the zero voltage to the data line.

14. The operation method of claim 13, further comprising:

when erasing the first memory unit, applying the zero voltage to the control line, floating the word line, floating the match line, applying an erase voltage to the bit line, and floating the data line; and when erasing the second memory unit, floating the control line, applying the zero voltage to the word line, floating the match line, floating the bit line, and applying the erase voltage to the data line.

15. The operation method of claim 13, further comprising:

when reading the first memory unit, applying a read voltage to the control line, applying the zero voltage to the word line, applying the zero voltage to the match line, applying a test voltage to the bit line, and applying the zero voltage to the data line; and when reading the second memory unit, applying the zero voltage to the control line, applying the read voltage to the word line, applying the zero voltage to the match line, applying the zero voltage to the bit line, and applying the test voltage to the data line.

16. The operation method of claim 9, wherein the another end of the first variable impedance passive component and the another end of the second variable impedance passive component are electrically connected to a word line, and the step of applying the working voltage to the another end of the first variable impedance passive component and the another end of the second variable impedance passive component comprises:

applying the working voltage to the word line.

17. The operation method of claim 16, further comprising:

when programming the first memory unit and the second memory unit, applying a programming voltage to the word line, floating the match line, applying a zero voltage to the bit line, and applying the zero voltage to the data line;

when erasing the first memory unit, applying the zero voltage to the word line, floating the match line, applying an erase voltage to the bit line, and floating the data line; and when erasing the second memory unit, applying the zero voltage to the word line, floating the match line, floating the bit line, and applying the erase voltage to the data line.

18. The operation method of claim 17, further comprising:

when reading the first memory unit, applying a read voltage to the word line, floating the match line, applying a test voltage to the bit line, and applying the zero voltage to the data line; and when reading the second memory unit, applying the read voltage to the word line, floating the match line, applying the zero voltage to the bit line, and applying the test voltage to the data line.

* * * * *